US010062493B2

(12) United States Patent
Chang et al.

(10) Patent No.: US 10,062,493 B2
(45) Date of Patent: Aug. 28, 2018

(54) ELECTRONIC COMPONENT AND CIRCUIT BOARD HAVING THE SAME MOUNTED THEREON

(71) Applicant: SAMSUNG ELECTRO-MECHANICS CO., LTD., Suwon (KR)

(72) Inventors: Geon Se Chang, Seoul (KR); Young Do Kweon, Suwon (KR); Jin Hyuck Yang, Yongin (KR)

(73) Assignee: SAMSUNG ELECTRO-MECHANICS CO., LTD., Suwon-si, Gyeonggi-do ( * ) Notice: Subject to any disclaimer, the term of this patent is extended or adjusted under 35 U.S.C. 154(b) by 252 days.

(21) Appl. No.: 14/552,867

(22) Filed: Nov. 25, 2014

(65) Prior Publication Data

US 2015/0145629 A1 May 28, 2015

(30) Foreign Application Priority Data

Nov. 26, 2013 (KR) ........................ 10-2013-0144683
Nov. 5, 2014 (KR) ........................ 10-2014-0152530

(51) Int. Cl.
*H01F 27/29* (2006.01)
*H01F 5/00* (2006.01)
(Continued)

(52) U.S. Cl.
CPC ..... *H01F 27/2804* (2013.01); *H01F 17/0006* (2013.01); *H01F 27/292* (2013.01); *H01F 2027/2809* (2013.01)

(58) Field of Classification Search
CPC .... H01F 27/292; H01F 27/2804; H01F 27/29; H01F 2017/0093; H01F 17/0006
(Continued)

(56) References Cited

U.S. PATENT DOCUMENTS 5,196,377 A * 3/1993 Wagner ............... H01L 21/4803 257/E23.008
6,060,378 A * 5/2000 Rolfson .................. H01L 24/05 257/E23.02
(Continued)

FOREIGN PATENT DOCUMENTS

JP 3-069248 U 7/1991
JP 2001-015668 A 1/2001
(Continued)

OTHER PUBLICATIONS

Japanese Office Action dated Feb. 21, 2017 issued in Japanese Patent Application No. 2014-238658 (with English translation).
(Continued)

*Primary Examiner* — Alexander Talpalatski
*Assistant Examiner* — Joselito Baisa
(74) *Attorney, Agent, or Firm* — McDermott Will & Emery LLP

(57) ABSTRACT

An electronic component and a circuit board having the same mounted thereon. The electronic component includes: a base part; a coil part provided on the base part and including a coil formed by disposing conductive patterns in a spiral shape and an external terminal connected to an end portion of the coil; and a cover part including an external electrode having a first surface contacting an upper surface of the external terminal and a second surface opposing the first surface and a magnetic material part provided on the coil part, made of a magnetic material, and exposing the second surface, wherein a surface area of the first surface is larger than a surface area of the second surface.

24 Claims, 7 Drawing Sheets

(51) Int. Cl.
*H01F 27/28* (2006.01)
*H01F 17/00* (2006.01)

(58) Field of Classification Search
USPC .................................. 336/192, 200, 205, 208
See application file for complete search history.

(56) References Cited

U.S. PATENT DOCUMENTS

| | | | | |
|---|---|---|---|---|
| 6,301,114 | B1 * | 10/2001 | Ootani | H01L 23/3677 257/713 |
| 6,903,645 | B2 * | 6/2005 | Mizoguchi | H01F 17/0006 336/200 |
| 6,930,047 | B2 * | 8/2005 | Yamazaki | C03C 15/00 257/E21.252 |
| 7,015,141 | B2 * | 3/2006 | Yamazaki | H01L 21/2026 257/E21.413 |
| 7,176,772 | B2 * | 2/2007 | Maeda | H01F 17/0013 336/200 |
| 7,619,500 | B1 * | 11/2009 | Nishikawa | H01F 17/0013 336/200 |
| 7,666,718 | B2 * | 2/2010 | Suzawa | C23F 4/00 257/E21.413 |
| 7,679,475 | B2 * | 3/2010 | Yoshikawa | H01P 1/20345 333/20 |
| 8,050,045 | B2 * | 11/2011 | Okuzawa | H01F 27/292 29/830 |
| 8,451,083 | B2 * | 5/2013 | Okumura | H01F 17/0013 336/200 |
| 8,471,668 | B2 * | 6/2013 | Hsieh | H01F 17/0013 336/200 |
| 8,988,180 | B2 * | 3/2015 | Arata | H01F 27/2804 336/192 |
| 2005/0082653 | A1 * | 4/2005 | McWilliams | B81C 1/00293 257/678 |
| 2007/0040163 | A1 * | 2/2007 | Okuzawa | H01F 27/292 257/31 |
| 2007/0063804 | A1 * | 3/2007 | Watanabe | H01F 3/10 336/83 |
| 2009/0029185 | A1 * | 1/2009 | Lee | H01F 41/046 428/573 |
| 2011/0291790 | A1 * | 12/2011 | Okumura | H01F 17/0013 336/200 |
| 2012/0133472 | A1 * | 5/2012 | Nishikawa | H01F 17/04 336/200 |
| 2013/0112869 | A1 * | 5/2013 | Synal | H01J 49/26 250/283 |
| 2013/0222101 | A1 * | 8/2013 | Ito | H01F 17/04 336/83 |
| 2014/0176279 | A1 * | 6/2014 | Yang | H01F 5/04 336/192 |

FOREIGN PATENT DOCUMENTS

| | | | |
|---|---|---|---|
| JP | 2003-298240 | A | 10/2003 |
| JP | 2005-210010 | A | 8/2005 |
| JP | 2008-091874 | A | 4/2008 |
| JP | 2011-014747 | A | 1/2011 |
| JP | 2013-235997 | A | 11/2013 |
| KR | 10-2013-0047572 | | 5/2013 |
| WO | 2012/053439 | A1 | 4/2012 |
| WO | 2012/056883 | A1 | 5/2012 |

OTHER PUBLICATIONS

Japanese Office Action dated Feb. 6, 2018 issued in Japanese Patent No. 2014-238658 (with English translation).

* cited by examiner

ELECTRONIC COMPONENT AND CIRCUIT BOARD HAVING THE SAME MOUNTED THEREON

CROSS REFERENCE(S) TO RELATED APPLICATIONS

This application claims the foreign priority benefit under 35 U.S.C. Section 119 of Korean Patent Application No. 10-2013-0144683, filed Nov. 26, 2013, and Korean Patent Application No. 10-2014-0152530, filed Nov. 5, 2014, the entire disclosures of which are hereby incorporated by reference in their entirety into this application.

BACKGROUND

The present disclosure relates to an electronic component and a circuit board having the same mounted thereon.

Recently, in accordance with the trend toward miniaturization and slimness of various electronic products, such as a smart phone, a tablet personal computer (PC), and the like, a study on miniaturization and thinness of various electronic components mounted in the electronic products has been continuously conducted.

As an example, a common mode filter (CMF) that has been widely used in various electronic devices in order to remove common mode noise is one of the electronic components that have been continuously studied in order to improve noise removing performance simultaneously with miniaturization and thinness.

These electronic components are mainly mounted on or embedded in a circuit board to implement a communication module, a power module, or the like.

Meanwhile, since various characteristics, such as impedance characteristics, or the like, should be satisfied simultaneously with miniaturizing and sliming these electronic components, there are various limitations in designing and disposing components, such as circuits, terminals, electrodes, and the like, in an inner portion of the electronic components.

In addition, due to these limitations, a problem that electrical connectivity, physical coupling reliability, or the like, between the components is decreased in a process of miniaturizing and sliming the electronic components may occur.

SUMMARY

An object of the present disclosure is to provide an electronic component capable of having improved electrical and physical connectivity with inner and outer portions thereof without having decreased characteristics.

Another object of the present disclosure is to provide a circuit board on which an electronic component capable of having improved electrical and physical connectivity with inner and outer portions thereof without having decreased characteristics is mounted.

According to an embodiment of the present disclosure, there is provided an electronic component including: a base part made of a magnetic material; a coil part provided on the base part and including a coil formed by disposing conductive patterns in a spiral shape and an external terminal connected to an end portion of the coil; and a cover part including an external electrode having a first surface contacting an upper surface of the external terminal and a second surface opposing the first surface and a magnetic material part provided on the coil part, made of a magnetic material, and exposing the second surface, wherein an area of the first surface is larger than that of the second surface.

A maximum value of a width of the first surface in a long side direction may be larger than that of a width of the second surface in the long side direction.

The maximum value of the width of the second surface in the long side direction may be 0.4 to 0.9 times the maximum value of the width of the first surface in the long side direction.

A maximum value of a width of the first surface in a short side direction may be larger than that of a width of the second surface in the short side direction.

The maximum value of the width of the second surface in the short side direction may be 0.5 to 0.9 times the maximum value of the width of the first surface in the short side direction.

The area of the second surface may be 0.2 to 0.8 times the area of the first surface.

At least one of a condition in which an angle between a surface including a long side of the first surface and a long side of the second surface and the short side of the first surface is 80 to 86 degrees and a condition in which an angle between a surface including a short side of the first surface and a short side of the second surface and the long side of the first surface is 70 to 86 degrees may be satisfied.

According to another embodiment of the present disclosure, there is provided an electronic component including: a base part made of a magnetic material; a coil part provided on the base part and including a coil formed by disposing conductive patterns in a spiral shape and an external terminal connected to an end portion of the coil; an external electrode having a first surface contacting the external terminal, a second surface opposing the first surface, and a side surface connecting between the first surface and the second surface; and a magnetic material part made of a magnetic material and covering a surface of the coil part and the side surface of the external electrode, wherein a vertical cross section of the external electrode cut in a direction perpendicular to at least one of the first surface and the second surface has a trapezoidal shape.

An intersection line between the side surface of the external electrode and the vertical cross section may be a straight line or a curved line.

A gradient of a tangent line of the curved line may be increased from the first surface toward the second surface.

According to still another embodiment of the present disclosure, there is provided an electronic component including: a coil part including a coil formed by disposing conductive patterns in a spiral shape and an external terminal connected to one end of the coil and provided between a base part made of a magnetic material and a magnetic material part; and an external electrode having one surface contacting the external terminal and the other surface opposing one surface and exposed to the outside of the magnetic material part, wherein a side surface of the external electrode forms an inclination with respect to one surface of the external electrode.

An angle formed by the side surface and one surface of the external electrode may be 70 to 86 degrees.

The electronic component may be a common mode filter.

According to yet still another embodiment of the present disclosure, there is provided a circuit board having the electronic component as described above mounted thereon, including: a board; and a circuit pattern formed on the board and having the second surface of the external electrode electrically connected thereto.

The circuit board may further include a conductive solder paste provided between the second surface of the external electrode and the circuit pattern.

DESCRIPTION OF THE PREFERRED EMBODIMENTS

Figure 1:
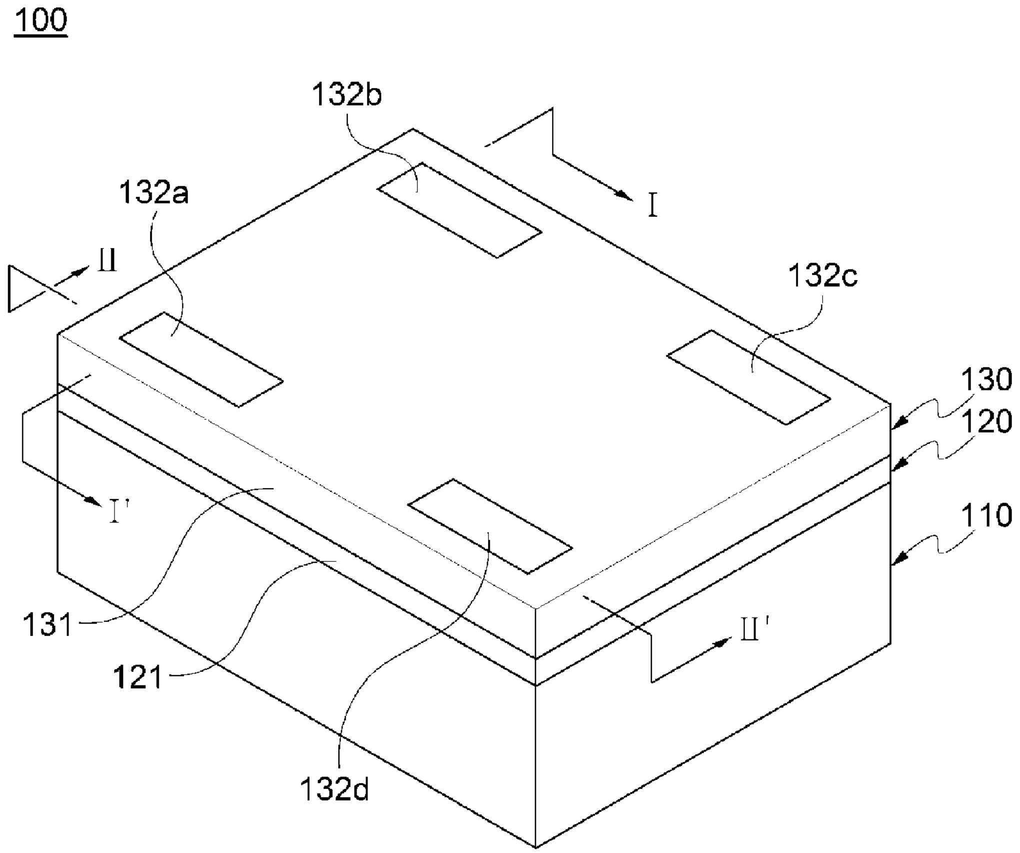
FIG. 1 is a perspective view schematically showing an electronic component according to an embodiment of the present disclosure.

Various advantages and features of the present disclosure and methods accomplishing them will become apparent from the following description of embodiments with reference to the accompanying drawings. However, the present disclosure is limited to the embodiments set forth herein, but may be modified in many different forms. Like reference numerals throughout the description denote like elements.

Terms used in the present specification are for explaining embodiments rather than limiting the present disclosure. Unless explicitly described to the contrary, a singular form includes a plural form in the present specification. The word "comprise" and variations such as "comprises" or "comprising," will be understood to imply the inclusion of stated constituents, steps, operations and/or elements, but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of embodiments of the present disclosure from being unnecessarily obscure. Additionally, components shown in the accompanying drawings are not necessarily shown to scale. For example, sizes of some components shown in the accompanying drawings may be exaggerated as compared with other components in order to assist in understanding of embodiments of the present disclosure. Like reference numerals on different drawings will denote like components, and similar reference numerals on different drawings will denote similar components, but are not necessarily limited thereto.

In the specification and the claims, terms such as "first", "second", "third", "fourth", and the like, if any, will be used to distinguish similar components from each other and be used to describe a specific sequence or a generation sequence, but is not necessarily limited thereto. It may be understood that these terms are compatible with each other under an appropriate environment so that embodiments of the present disclosure to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top", "bottom", "over", "under", and the like, if any, do not necessarily indicate relative positions that are not changed, but are used for description. It may be understood that these terms are compatible with each other under an appropriate environment so that embodiments of the present disclosure to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an embodiment" means the same embodiment, but is not necessarily limited thereto.

Hereinafter, a configuration and an acting effect of embodiments of the present disclosure will be described in more detail with reference to the accompanying drawings.

Figure 2:
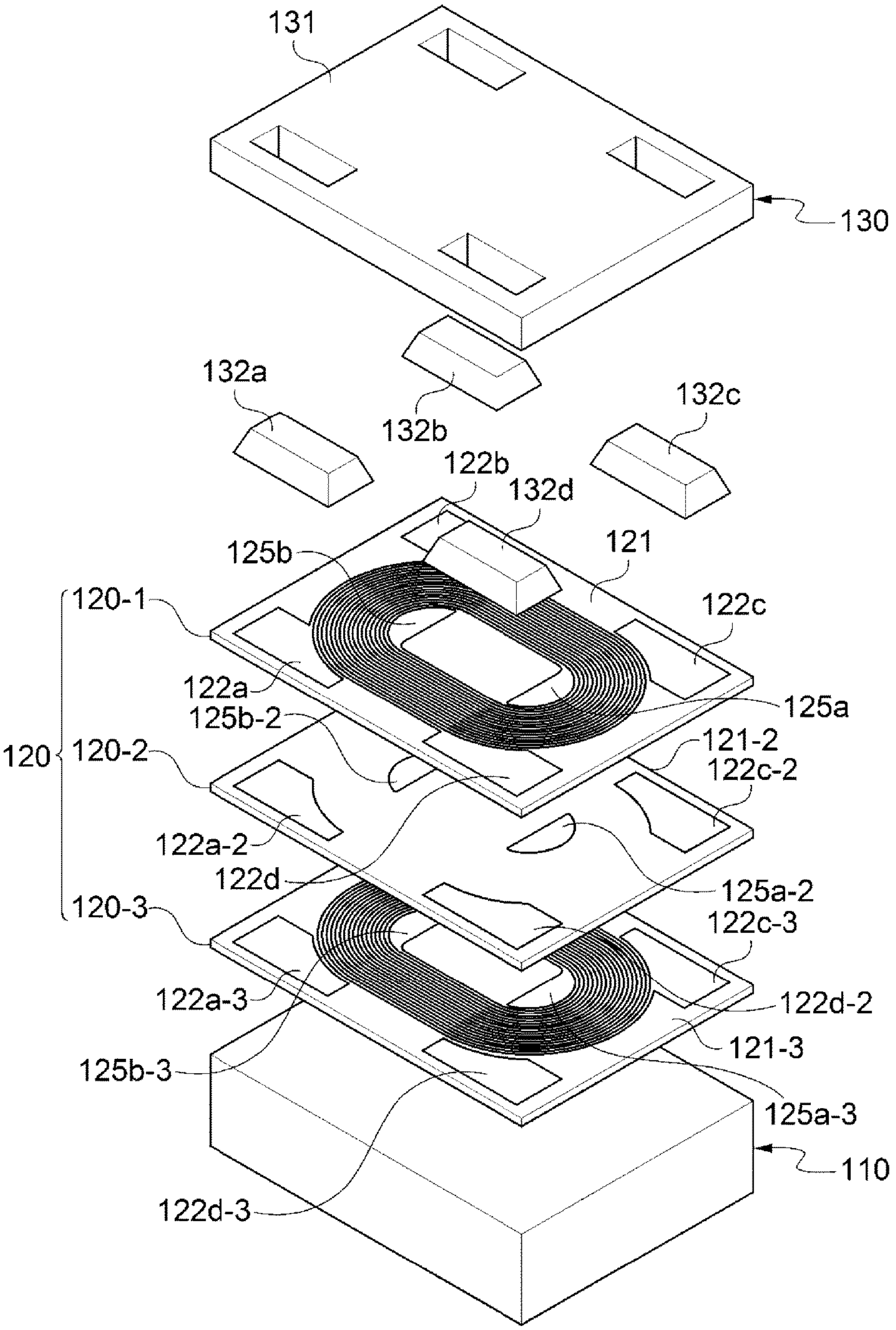
FIG. 2 is an exploded perspective view schematically showing the electronic component according to an embodiment of the present disclosure.
Figure 3:
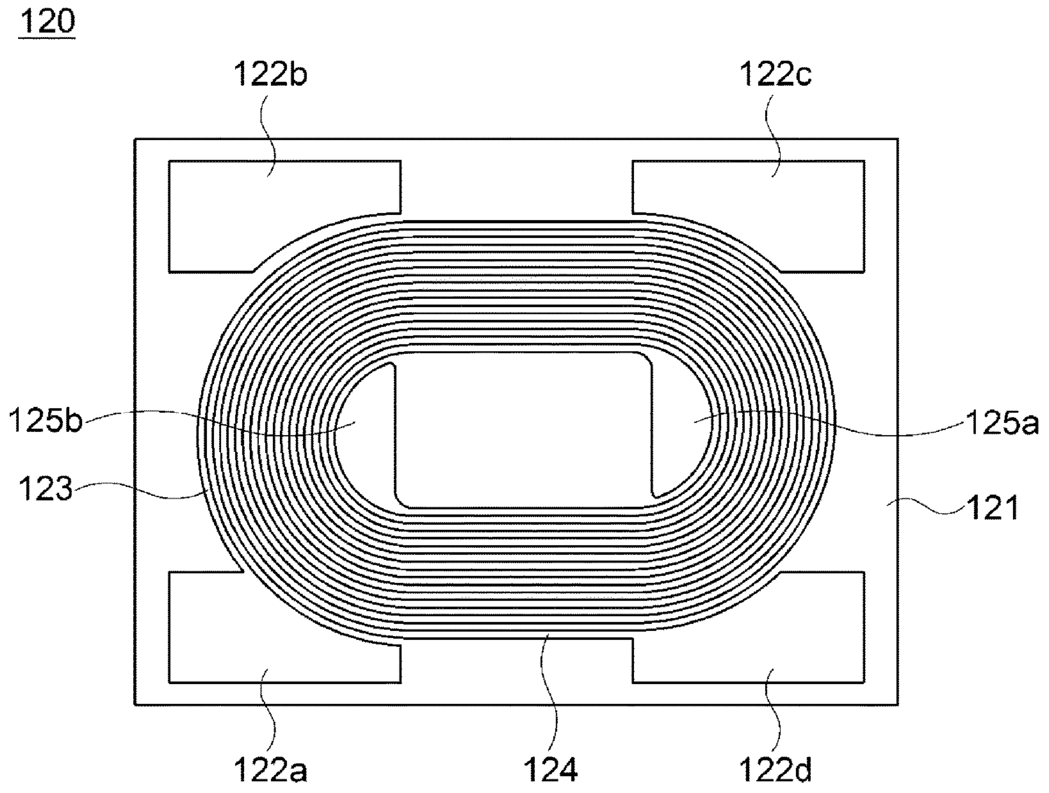
FIG. 3 is a plan view schematically showing a coil part according to an embodiment of the present disclosure.
Figure 4A:
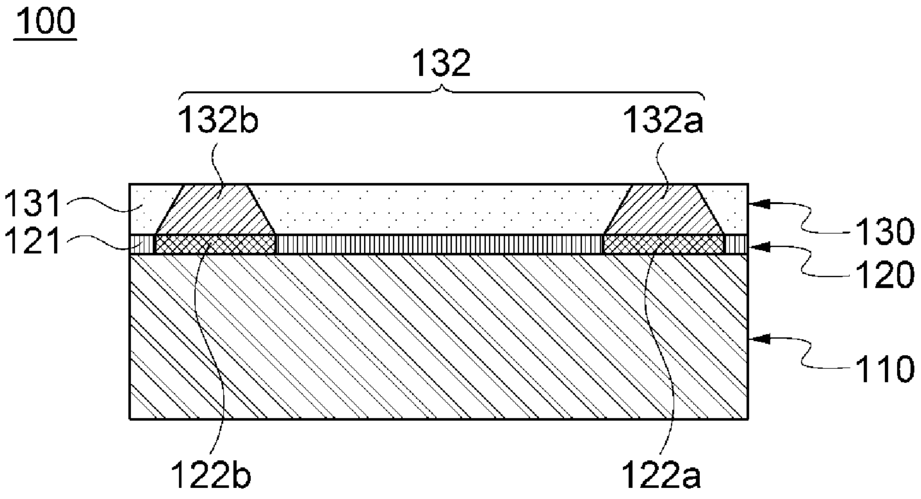
FIG. 4A is a cross-sectional view taken along line I-I' of FIG. 1.
Figure 4B:
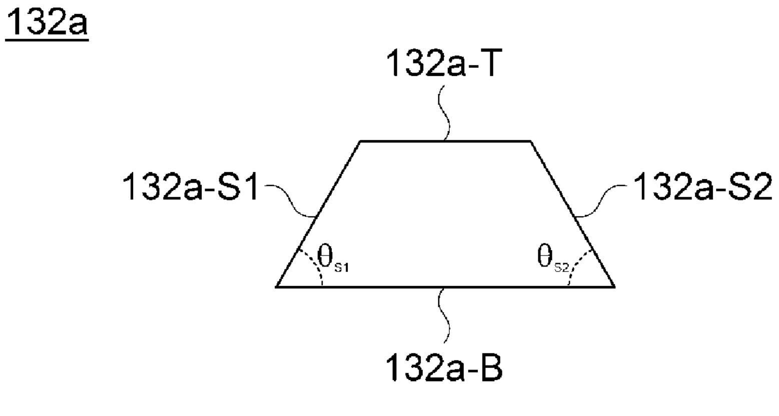
FIG. 4B is a view schematically showing an external electrode of FIG. 4A.
Figure 5A:
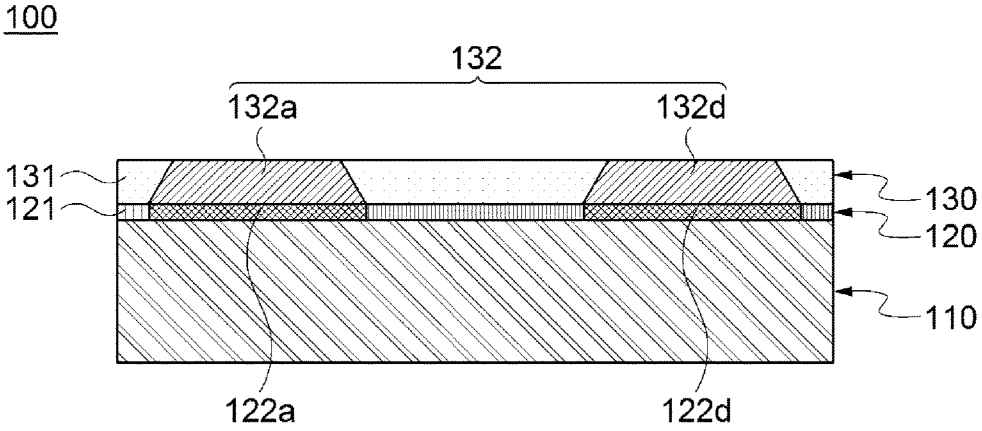
FIG. 5A is a cross-sectional view taken along line II-II' of FIG. 1.
Figure 5B:
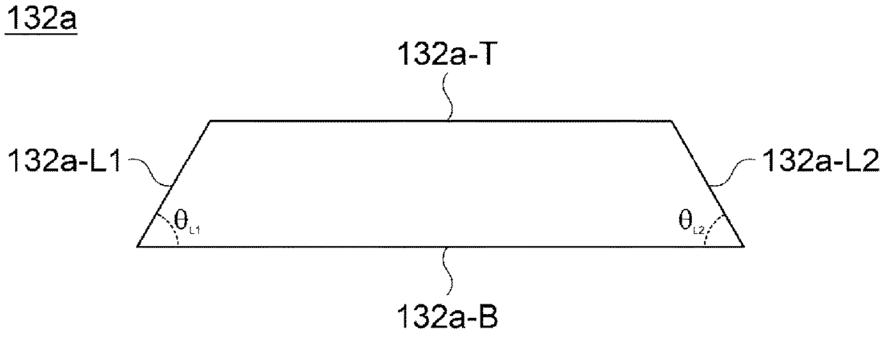
FIG. 5B is a view schematically showing an external electrode of FIG. 5A.
Figure 6:
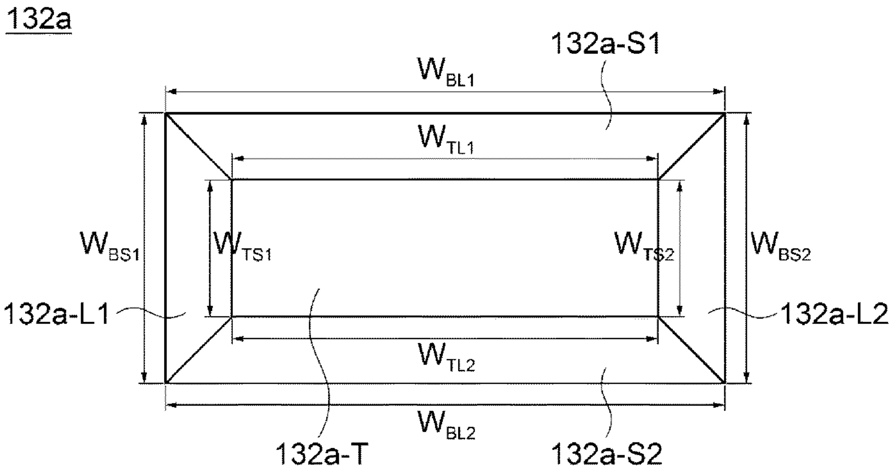
FIG. 6 is a plan view schematically showing an external electrode according to an embodiment of the present disclosure.

FIG. 1 is a perspective view schematically showing an electronic component 100 according to an embodiment of the present disclosure; FIG. 2 is an exploded perspective view schematically showing the electronic component 100 according to an embodiment of the present disclosure; FIG. 3 is a plan view schematically showing a coil part 120 according to an embodiment of the present disclosure; FIG. 4A is a cross-sectional view taken along line I-I' of FIG. 1; FIG. 4B is a view schematically showing an external electrode 132 of FIG. 4A; FIG. 5A is a cross-sectional view taken along line II-II' of FIG. 1; FIG. 5B is a view schematically showing an external electrode 132 of FIG. 5A; and FIG. 6 is a plan view schematically showing an external electrode 132 according to an embodiment of the present disclosure.

Referring to FIGS. 1-3, 4A, 4B, 5A, 5B, and 6, the electronic component 100 according to an embodiment of the present disclosure may include a base part 110, a coil part 120, and a cover part 130.

Here, the base part 110 may be made of a magnetic material.

The coil part 120 may include coils and external terminals 122. In addition, the coils and the external terminals 122 may be formed on one surface or both surfaces of an insulating part 121, and the external terminals 122 may be formed so as to penetrate through the insulating part 121.

The coils may be formed by disposing conductive patterns in a spiral shape, and the external terminals 122 may be connected to one ends of the coils.

In an embodiment of the present disclosure, the coils and the external terminals 122 may be formed on the same plane.

Further, an internal terminal 125 may be connected to the other end of the coil.

Meanwhile, the coil may include a primary coil 123 and a secondary coil 124.

Here, the primary coil 123 and the secondary coil 124 may be disposed in a spiral shape in a state in which they are spaced apart from each other by a predetermined distance.

In addition, two or more insulating parts 121 on which the coils 123 and 124 and/or the external terminals 122 are formed may be stacked to form the coil part 120. Here, the coils formed on different layers further include vias (not shown) contacting the internal terminals 125, such that they may be electrically connected to each other.

In addition, the external terminals 122, the internal terminals 125, or the like, may be formed so as to penetrate between upper and lower surfaces of the insulating part 121 and be then exposed in both of an upper surface direction and a lower surface direction of the insulating part 121, and coil patterns may be formed so as to be exposed in only one of the upper surface direction and the lower surface direction of the insulating part 121.

Here, although not shown, the primary coil 123 may be formed on one layer, and the secondary coil 124 may be formed on another layer.

In addition, although the case in which the coil part 120 includes three layers has been shown in FIG. 2, or the like, it is to be understood that the coil part 120 may include a larger number of layers or a smaller number of layers than the three layers.

Meanwhile, in FIG. 3, or the like, an example in which external terminals 122*a*, 122*b*, 122*c*, and 122*d* generally have a rectangular shape and sides thereof facing the coil have a concavely depressed shape is shown.

As the electronic component 100 is miniaturized, regions in which the external terminals 122 are to be formed are decreased in order to secure more turns of the coil in a limited region. However, as surface areas of the external terminals 122 become large, coupling force between the external terminals 122 and the external electrodes 132 may be improved. Therefore, the surface areas of the external terminals 122 need to be maximized. To this end, the external terminals 122 are not implemented in a simple rectangular shape, but may be implemented so that portions thereof facing the coil are concavely depressed so as to correspond to a shape of the coil.

Here, in the case in which the portions of the external terminals 122 facing the coil are depressed so as to correspond to the shape of the coil, lower surfaces of each of the external electrodes 132 contacting upper surfaces of the external terminals 122 may be implemented in shapes corresponding to those of the external terminals 122.

In addition, the lower surfaces of each of the external electrodes 132 may also be formed so as not to correspond to the shapes of the external terminals 122, which is shown in FIG. 2. However, in this case, the external electrodes 132 and the coil contact each other, such that a short-circuit may occur. In order to solve this problem, the upper surface of the external terminal 122 may be disposed so as to be higher than that of the coil or an insulating film covering the upper surface of the coil may be further provided.

Figure 8:
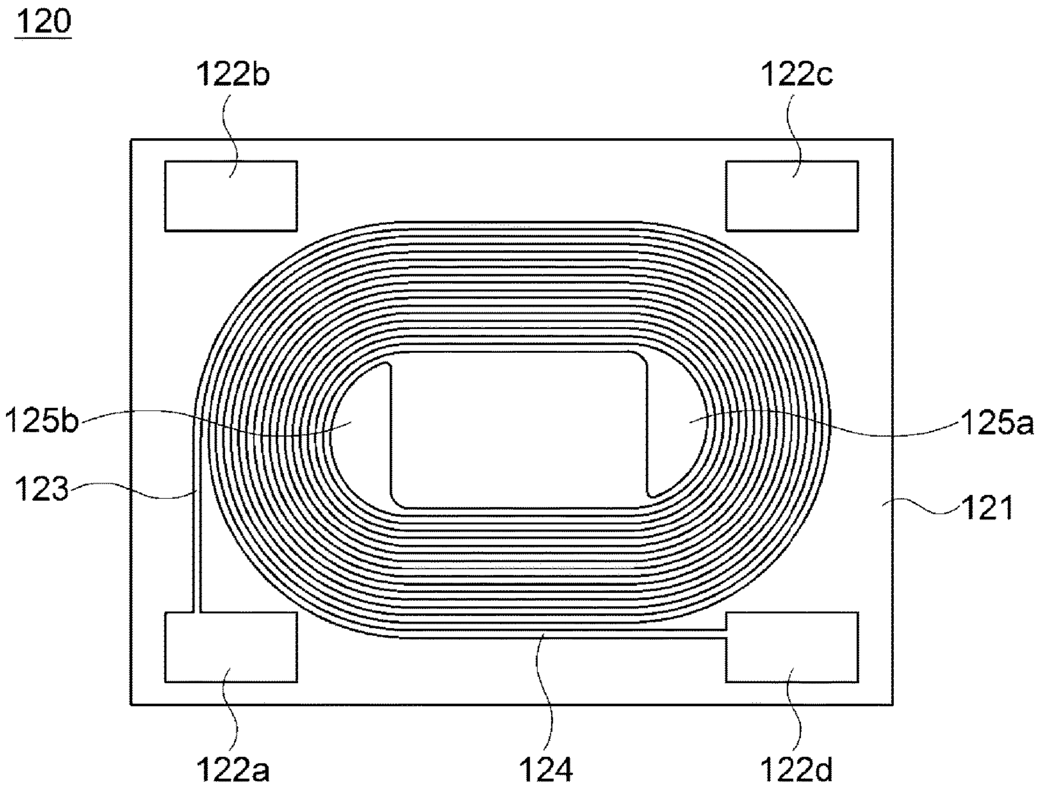
FIG. 8 is a view showing a modified example of FIG. 3.

However, the external terminals 122 may also be implemented in a simple rectangular shape, as shown in FIG. 8.

Meanwhile, it is advantageous in improving the coupling force between the external terminals 122 and the external electrodes 132 that the lower surfaces of the external electrodes 132 are formed so as to cover at least entire upper surfaces of the external terminals 122.

The cover part 130 may include the external electrode 132 and a magnetic material part 131.

The magnetic material part 131 may be made of a magnetic composite in which a synthetic resin is mixed with a magnetic material or the magnetic material.

The external electrodes 132 may be made of a conductive material, may directly contact the external terminals 122 of the coil part 120, and may include surfaces exposed to an outer surface of the electronic component 100.

For convenience of the understanding for the external electrode 132, in the present description, a surface contacting the external terminal 122*a*, that is, a lower surface of an external electrode 132*a* will be called a first surface 132*a*-B, and a surface opposing the first surface 132*a*-B, that is, an upper surface of the external electrode 132*a* will be called as a second surface 132*a*-T.

In the electronic component 100 according to an embodiment of the present disclosure, the first surface 132*a*-B of the external electrode 132*a* may be formed so as to be wider than the second surface 132*a*-T thereof.

In accordance with miniaturization of the electronic component 100, a space in which the coil and the external terminal 122*a* may be formed becomes narrow. However, in spite of the miniaturization of the electronic component 100, it has been required to implement performance of the electronic component 100 at a level similar to or more excellent than that of an existing electronic component.

For example, in the case in which the electronic component 100 is a common mode filter, it has been required to accomplish miniaturization of the common mode filter and further improve noise decrease characteristics of the common mode filter. Here, the noise decrease characteristics of the common mode filter mainly depend on impedance characteristics of the common mode filter. Turns of the coil should be increased or characteristics of a material provided around the coil should be improved in order to improve the impedance characteristics.

However, there is a limitation in improving characteristics of a magnetic material used in the common mode filter. In addition, there is also a limitation in a technology for finely forming conductive patterns configuring the coil. Therefore, as an area of a surface on which the coil is formed becomes narrow, there is a limitation in securing sufficient turns.

Therefore, a decrease in an entire volume of the electronic component 100 has needed to be minimized in order to maintain characteristics of the electronic component 100 at a predetermined level or more while decreasing sizes of a long side and a short side of the electronic component 100 based on a surface horizontal to the coil part 120.

As a result, there was a limitation in decreasing a thickness of the electronic component 100 even though widths of the electronic component 100 in horizontal and vertical directions are continuously decreased.

Meanwhile, the external electrode 132 is generally provided in order to electrically connect the coil formed in the electronic component 100 to another device or circuit disposed outside the electronic component 100.

Here, in the case in which the thickness of the electronic component 100 is less decreased even though the widths of the electronic component 100 in the horizontal and vertical directions are decreased as described above, an aspect ratio of the external electrode 132 must become large.

For example, an area of the external terminal 122 connected to one end of the coil must be decreased due to the decrease in the widths of the electronic component 100 in the horizontal and vertical directions. As a result, an area of a surface on which the external electrode 132 contacts the external terminal 122 is also decreased. However, in order to maintain or improve the characteristics of the electronic component 100, a volume of the magnetic material part 131 included in the electronic component 100 should be secured at a predetermined level or more.

Therefore, a decrease degree in a thickness of the external electrode 132 must be smaller than a decrease degree in widths of the external electrode 132 in the horizontal and vertical directions. As a result, the aspect ratio of the external electrode 132 becomes large.

However, as the aspect ratio of the external electrode 132 becomes large, contact reliability between the external terminal 122 and the external electrode 132 is decreased. That is, the possibility that a problem that the external electrode 132 is separated from the external terminal 122 or a contact between the external electrode 132 and the external terminal 122 is weakened in a process of forming the external electrode 132 after forming the coil part 120, a process of filling the magnetic material part 131, a process of mounting the electronic component 100 on a circuit board 210, and the like, will occur is increased.

Therefore, a manufacturing yield of the electronic component 100 may be deteriorated, and the external terminal 122 and the external electrode 132 may be separated from each other or a contact resistance between the external terminal 122 and the external electrode 132 may be rapidly increased, even with small impact after the electronic component 100 is mounted in an electronic product.

Here, referring to FIG. 4B, since the electronic component 100 according to an embodiment of the present disclosure may be formed so that the first surface 132*a*-B of the external electrode 132*a* has an area wider than that of the second surface 132*a*-T thereof, electrical connectivity and coupling reliability between the first surface 132*a*-B of the external electrode 132*a* and the external terminal 122*a* may be improved.

Figure 9:
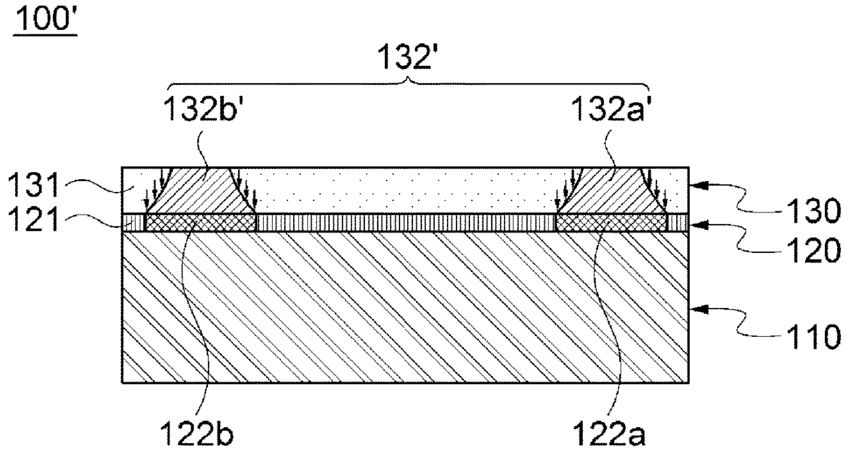
FIG. 9 is a view for describing a principle in which close adhesion between an external electrode and an external terminal in the electronic component according to an embodiment of the present disclosure is improved.

That is, when the first surface 132*a*-B of the external electrode 132*a* is formed so as to be wider than the second surface 132*a*-T thereof, side surfaces 132*a*-S1, 132*a*-S2, 132*a*-L1, and 132*a*-L2 of the external electrode 132*a* may form an inclination with respect to the first surface 132*a*-B. Therefore, as shown in FIG. 9, the magnetic material part 131 may press the side surfaces 132*a*-S1, 132*a*-S2, 132*a*-L1, and 132*a*-L2 of the external electrode 132*a* toward the coil part 120, such that coupling force between the first surface 132*a*-B of the external electrode 132*a* and the external terminal 122*a* may be improved.

TABLE 1

| When $\theta_S$ = 86° | | | | |
|---|---|---|---|---|
| $W_{TL}/W_{BL}$ | Close Adhesion | Goodness/Defect Decision | Defective Rate (%) | Board Mounting |
| 0.1 | O | O | 3 | X |
| 0.2 | O | O | 3 | X |
| 0.3 | O | O | 3 | X |
| 0.31 | O | O | 3 | X |
| 0.32 | O | O | 2 | X |
| 0.33 | O | O | 2 | X |
| 0.34 | O | O | 2 | X |
| 0.35 | O | O | 5 | X |
| 0.36 | O | O | 5 | X |
| 0.37 | O | O | 5 | x |
| 0.38 | O | O | 5 | X |
| 0.39 | O | O | 5 | X |

TABLE 1-continued

| When $\theta_S$ = 86° | | | | |
|---|---|---|---|---|
| $W_{TL}/W_{BL}$ | Close Adhesion | Goodness/Defect Decision | Defective Rate (%) | Board Mounting |
| 0.4 | O | O | 5 | O |
| 0.5 | O | O | 5 | O |
| 0.6 | O | O | 5 | O |
| 0.7 | O | O | 5 | O |
| 0.8 | O | O | 9 | O |
| 0.9 | O | O | 9 | O |
| 0.91 | O | X | 15 | O |
| 0.92 | O | X | 15 | O |
| 0.93 | O | X | 15 | O |
| 0.94 | X | X | 25 | O |
| 0.95 | X | X | 34 | O |
| 1 | X | X | 38 | O |
| 1.1 | X | X | 42 | O |
| 1.2 | X | X | 42 | O |
| 1.3 | X | X | 42 | O |

Table 1 is a table showing measurement results obtained by performing close adhesion, goodness/defect decision, defective rate, and board mounting tests while changing a ratio of a maximum value WTL of a width of the second surface 132*a*-T of the external electrode 132*a* in a long side direction to a maximum value WBL of a width of the first surface 132*a*-B of the external electrode 132*a* in the long side direction in a state in which other variables are fixed.

Here, a tape test was performed in a scheme of attaching the electronic component 100 to a tape so that the external electrode 132 contacts the tape and then detaching the electronic component 100 from the tape, and a close adhesion item was denoted as O in the case in which a ratio of the number of electronic components from which an external electrode is separated to the total number of test target electronic components is less than 10% and was denoted as X otherwise.

In addition, a conduction test was performed after the above-mentioned tape test is performed, and a goodness/defect decision item was denoted as O in the case in which a ratio of the number of electronic components decided to be defective at the time of the conduction test to the total number of test target electronic components is less than 10% and was denoted as X otherwise. Here, the ratio of the number of electronic components decided to be defective at the time of the conduction test to the total number of test target electronic components was denoted as a defective rate.

In addition, a board mounting test in which the test target electronic components are mounted on a board was performed, and a board mounting item was denoted as O in the case in which a ratio of the number of electronic components in which a mounting defect occurs to the total number of test target electronic components is less than 10% and was denoted as X otherwise.

The external electrode 132*a* of the electronic component 100 according to an exemplary embodiment of the present disclosure is formed so that the maximum value of the width of the first surface 132*a*-B in the long side direction is larger than that of the width of the second surface 132*a*-T in the long side direction.

Here, referring to FIG. 6, the maximum value of the width of the first surface 132*a*-B in the long side direction may be defined as WBL, and the maximum value of the width of the second surface 132*a*-T in the long side direction may be defined as WTL.

Here, referring to Table 1, when the maximum value WTL of the width of the second surface 132*a*-T in the long side direction is excessively smaller than the maximum value WBL of the width of the first surface 132*a*-B in the long side direction, a defect may occur in a process in which the electronic component 100 is mounted on the circuit board 210, or the like. Particularly, it was confirmed that a board mounting defective rate is rapidly increased in the case in which WTL/WBL is less than 0.4 as compared with the case in which WTL/WBL is 0.4 or more.

In addition, when the maximum value WTL of the width of the second surface 132*a*-T in the long side direction is excessively large, electrical connectivity or contact reliability between the first surface 132*a*-B of the external electrode 132*a* and the external terminal 122*a* may be decreased. Particularly, it was confirmed that a defect occurrence rate in the conduction test is rapidly increased in the case in which WTL/WBL exceeds 0.9 as compared with the case in which WTL/WBL is 0.9 or less.

Therefore, it may be preferable to form the external electrode 132*a* so that the maximum value WTL of the width of the second surface 132*a*-T in the long side direction is 0.4 to 0.9 times the maximum value WBL of the width of the first surface 132*a*-B in the long side direction.

TABLE 2

| When $\theta_L$ = 86° | | | | |
|---|---|---|---|---|
| $W_{TS}/W_{BS}$ | Close Adhesion | Goodness/Defect Decision | Defective Rate (%) | Board Mounting |
| 0.1 | ○ | ○ | 2 | X |
| 0.2 | ○ | ○ | 2 | X |
| 0.3 | ○ | ○ | 2 | X |
| 0.31 | ○ | ○ | 3 | X |
| 0.32 | ○ | ○ | 3 | X |
| 0.33 | ○ | ○ | 3 | X |
| 0.34 | ○ | ○ | 3 | X |
| 0.35 | ○ | ○ | 5 | X |
| 0.36 | ○ | ○ | 5 | X |
| 0.37 | ○ | ○ | 5 | X |
| 0.38 | ○ | ○ | 5 | X |
| 0.39 | ○ | ○ | 2 | X |
| 0.4 | ○ | ○ | 2 | X |
| 0.5 | ○ | ○ | 2 | ○ |
| 0.6 | ○ | ○ | 2 | ○ |
| 0.7 | ○ | ○ | 8 | ○ |
| 0.8 | ○ | ○ | 8 | ○ |
| 0.9 | ○ | ○ | 8 | ○ |
| 0.91 | ○ | X | 12 | ○ |
| 0.92 | ○ | X | 12 | ○ |
| 0.93 | ○ | X | 12 | ○ |
| 0.94 | ○ | X | 12 | ○ |
| 0.95 | X | X | 15 | ○ |
| 1 | X | X | 15 | ○ |
| 1.1 | X | X | 15 | ○ |
| 1.2 | X | X | 17 | ○ |
| 1.3 | X | X | 17 | ○ |

Table 2 is a table showing measurement results obtained by performing close adhesion, goodness/defect decision, defective rate, and board mounting tests while changing a ratio of a maximum value WTS of a width of the second surface 132*a*-T of the external electrode 132*a* in a short side direction to a maximum value WBS of a width of the first surface 132*a*-B of the external electrode 132*a* in the short side direction in a state in which other variables are fixed.

Here, the meaning of close adhesion, goodness/defect decision, defective rate, and board mounting items is the same as that of the close adhesion, the goodness/defect decision, the defective rate, and the board mounting items described with reference to Table 1.

The external electrode 132*a* of the electronic component 100 according to an exemplary embodiment of the present disclosure may be formed so that the maximum value of the width of the first surface 132*a*-B in the short side direction is larger than that of the width of the second surface 132*a*-T in the short side direction.

Here, referring to FIG. 6, the maximum value of the width of the first surface 132*a*-B in the short side direction may be defined as WBS, and the maximum value of the width of the second surface 132*a*-T in the short side direction may be defined as WTS.

Here, referring to Table 2, when the maximum value WTS of the width of the second surface 132*a*-T in the short side direction is excessively smaller than the maximum value WBS of the width of the first surface 132*a*-B in the short side direction, a defect may occur in a process in which the electronic component 100 is mounted on the circuit board 210, or the like. Particularly, it was confirmed that a board mounting defective rate is rapidly increased in the case in which WTS/WBS is less than 0.5 as compared with the case in which WTS/WBS is 0.5 or more.

In addition, when the maximum value WTS of the width of the second surface 132*a*-T in the short side direction is excessively large, electrical connectivity or contact reliability between the first surface 132*a*-B of the external electrode 132*a* and the external terminal 122*a* may be decreased. Particularly, it was confirmed that a defect occurrence rate in the conduction test is rapidly increased in the case in which WTS/WBS exceeds 0.9 as compared with the case in which WTS/WBS is 0.9 or less.

Therefore, it may be preferable to form the external electrode 132*a* so that the maximum value WTS of the width of the second surface 132*a*-T in the short side direction is 0.5 to 0.9 times the maximum value WBS of the width of the first surface 132*a*-B in the short side direction.

TABLE 3

| $A_T/A_B$ | Close Adhesion | Goodness/Defect Decision | Defective Rate (%) | Board Mounting |
|---|---|---|---|---|
| 0.10 | ○ | ○ | 2 | X |
| 0.15 | ○ | ○ | 1 | X |
| 0.16 | ○ | ○ | 5 | X |
| 0.17 | ○ | ○ | 8 | X |
| 0.18 | ○ | ○ | 4 | X |
| 0.19 | ○ | ○ | 4 | X |
| 0.20 | ○ | ○ | 4 | ○ |
| 0.30 | ○ | ○ | 4 | ○ |
| 0.40 | ○ | ○ | 4 | ○ |
| 0.50 | ○ | ○ | 6 | ○ |
| 0.60 | ○ | ○ | 5 | ○ |
| 0.70 | ○ | ○ | 5 | ○ |
| 0.80 | ○ | ○ | 6 | ○ |
| 0.81 | ○ | X | 12 | ○ |
| 0.82 | X | X | 13 | ○ |
| 0.83 | X | X | 13 | ○ |
| 0.84 | X | X | 17 | ○ |
| 0.85 | X | X | 17 | ○ |
| 0.86 | X | X | 17 | ○ |
| 0.87 | X | X | 17 | ○ |
| 0.88 | X | X | 25 | ○ |
| 0.89 | X | X | 25 | ○ |
| 0.90 | X | X | 30 | ○ |
| 0.91 | X | X | 30 | ○ |
| 0.92 | X | X | 33 | ○ |
| 0.93 | X | X | 35 | ○ |
| 0.94 | X | X | 35 | ○ |
| 0.95 | X | X | 42 | ○ |
| 1.00 | X | X | 57 | ○ |
| 1.10 | X | X | 62 | ○ |
| 1.20 | X | X | 59 | ○ |
| 1.30 | X | X | 45 | ○ |

TABLE 3-continued

| $A_T/A_B$ | Close Adhesion | Goodness/Defect Decision | Defective Rate (%) | Board Mounting |
|---|---|---|---|---|
| 1.50 | X | X | 71 | X |
| 1.60 | X | X | 65 | X |
| 1.70 | X | X | 67 | X |

Table 3 is a table showing measurement results obtained by performing close adhesion, goodness/defect decision, defective rate, and board mounting tests while changing a ratio of an area AT of the second surface 132*a*-T of the external electrode 132*a* to an area AB of the first surface 132*a*-B of the external electrode 132*a* in a state in which other variables are fixed.

Here, the meaning of close adhesion, goodness/defect decision, defective rate, and board mounting items is the same as that of the close adhesion, the goodness/defect decision, the defective rate, and the board mounting items described with reference to Table 1.

The external electrode 132*a* of the electronic component 100 according to an exemplary embodiment of the present disclosure may be formed so that the area of the first surface 132*a*-B is larger than that of the second surface 132*a*-T.

Here, referring to FIG. 6, the area of the first surface 132*a*-B may be defined as AB, and the area of the second surface 132*a*-T may be defined as AT.

Here, in the case in which the area AT of the second surface 132*a*-T is excessively smaller than the area AB of the first surface 132*a*-B, a defect may occur in a process in which the electronic component 100 is mounted on the circuit board 210, or the like. Particularly, it was confirmed that a board mounting defective rate is rapidly increased in the case in which AT/AB is less than 0.2 as compared with the case in which AT/AB is 0.2 or more.

In addition, when the area AT of the second surface 132*a*-T is excessively large, electrical connectivity or contact reliability between the first surface 132*a*-B of the external electrode 132*a* and the external terminal 122*a* may be decreased. Particularly, it was confirmed that a defect occurrence rate in the conduction test is rapidly increased in the case in which AT/AB exceeds 0.8 as compared with the case in which AT/AB is 0.8 or less.

Therefore, it may be preferable to form the external electrode 132*a* so that the area AT of the second surface 132*a*-T is 0.2 to 0.8 times the area AB of the first surface 132*a*-B.

The external electrode 132*a* of the electronic component 100 according to an embodiment of the present disclosure may be formed so that an angle between a surface including a long side of the first surface 132*a*-B and a long side of the second surface 132*a*-T and the short side of the first surface 132*a*-B is 80 to 86 degrees.

In addition, the external electrode 132*a* of the electronic component 100 according to an embodiment of the present disclosure may be formed so that an angle between a surface including a short side of the first surface 132*a*-B and a short side of the second surface 132*a*-T and the long side of the first surface 132*a*-B is 70 to 86 degrees.

Referring to FIGS. 4B and 5B, the angle between the surface including the long side of the first surface 132*a*-B and the long side of the second surface 132*a*-T and the short side of the first surface 132*a*-B may be denoted as $\Theta_S$, and the angle between the surface including the short side of the first surface 132*a*-B and the short side of the second surface 132*a*-T and the long side of the first surface 132*a*-B may be denoted as $\Theta_L$.

When ΘS or ΘL is excessively small, a defect may occur in a process in which the electronic component 100 is mounted on the circuit board 210, or the like, and when ΘS or ΘL is excessively large, electrical connectivity or contact reliability between the first surface 132*a*-B of the external electrode 132*a* and the external terminal 122*a* may be decreased.

Meanwhile, in the electronic component 100 according to an exemplary embodiment of the present disclosure, a vertical cross section of the external electrode 132*a* cut in a direction perpendicular to at least one of the first surface 132*a*-B and the second surface 132*a*-T of the external electrode 132*a* may have a trapezoidal shape.

Here, surfaces connecting between the first surface 132*a*-B and the second surface 132*a*-T may be defined as side surfaces 132*a*-S1, 132*a*-S2, 132*a*-L1, and 132*a*-L2 of the external electrode 132*a*.

In addition, since the vertical cross section of the external electrode 132 has the trapezoidal shape, the side surfaces 132*a*-S1, 132*a*-S2, 132*a*-L1, and 132*a*-L2 of the external electrode 132*a* may form an inclination with respect to the first surface 132*a*-B.

Therefore, the magnetic material part 131 may press the side surfaces 132*a*-S1, 132*a*-S2, 132*a*-L1, and 132*a*-L2 of the external electrode 132*a* toward the coil part 120, such that coupling force between the first surface 132*a*-B of the external electrode 132*a* and the external terminal 122*a* may be improved.

Meanwhile, as shown in FIGS. 4B and 5B, an intersection line between the side surface 132*a*-L1 of the external electrode 132*a* and the vertical cross section may be a straight line.

Alternatively, as shown in FIG. 9, the intersection line between the side surface 132*a*-L1 of the external electrode 132*a* and the vertical cross section may be a curved line. Here, in the case in which the intersection line between the side surface 132*a*-L1 of the external electrode 132*a* and the vertical cross section is the curved line, it is advantageous in improving support force of the external electrode 132 by the magnetic material part 131 to form the external electrode 132*a* so as to have a form of a curved line of which a gradient of a tangent line is increased from the first surface 132*a*-B toward the second surface 132*a*-T.

However, although the respective lines are represented by smooth straight lines or curved lines in order to schematically show shapes of the external electrode 132, and the like, in the accompanying drawings, fine rugged parts may be formed on the corresponding straight lines or curved lines when the corresponding straight lines or curved lines are enlarged and observed at a predetermined magnification or more when the electronic component is implemented as an actual product.

Figure 7:
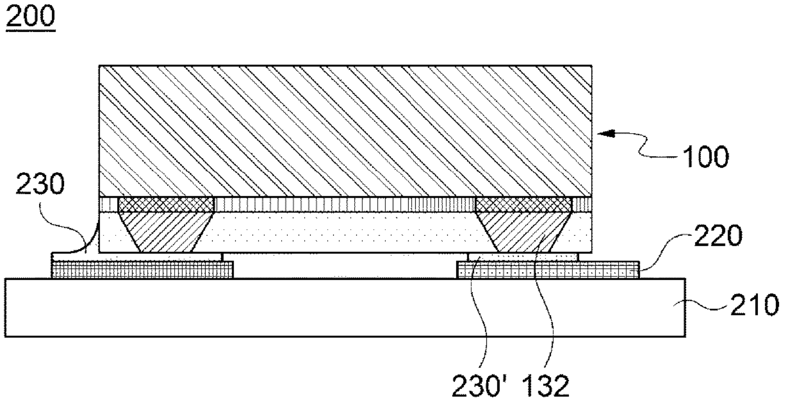
FIG. 7 is a cross-sectional view schematically showing a circuit board having an electronic component mounted thereon according to an embodiment of the present disclosure.

FIG. 7 is a cross-sectional view schematically showing a circuit board 200 having an electronic component mounted thereon according to an embodiment of the present disclosure.

Referring to FIG. 7, the circuit board 200 having an electronic component mounted thereon according to an embodiment of the present disclosure may be formed by electrically connecting the electronic component 100 to the board 210 on which circuit patterns 220 are formed.

Here, solder pastes 230 made of a conductive material are formed between the second surface 132*a*-T of the external electrode 132*a* and the circuit patterns 220, thereby making it possible to stably couple the electronic component 100 to the board 210 and secure electrical connectivity between the circuit patterns 220 and the external electrodes 132.

Meanwhile, in the case in which an area of the second surface 132*a*-T of the external electrode 132*a* is excessively small, coupling force between the circuit patterns 220 on the board 210 and the external electrodes 132 is weakened, such that a mounting defect may occur, and a contact resistance between the external electrodes 132 and the circuit patterns 220 is increased, such that a problem such as heat generation, a power efficiency decrease, or the like, may occur.

On the other hand, since an area of the first surface 132*a*-B of the external electrode 132*a* has a limitation depending on a surface area of the external terminal 122, in the case in which the area of the second surface 132*a*-T is excessively large, force at which the magnetic material part 131 presses the external electrode 132 toward the coil part 120 is weakened, such that coupling force between the external terminal 12 and the external electrode 122 may be weakened.

With the electronic component according to embodiments of the present disclosure as described above, electrical and physical connectivity with inner and outer portions of the electronic component may be improved without decreasing characteristics of the electronic component.

In addition, with the circuit board having the electronic component mounted thereon according to embodiments of the present disclosure as described above, electrical and physical connectivity with inner and outer portions of the electronic component may be improved without decreasing characteristics of the electronic component.

What is claimed is:

1. An electronic component comprising:

a base part made of a magnetic material;

a coil part provided on the base part and including a coil formed by disposing conductive patterns in a spiral shape and an external terminal connected to an end portion of the coil; and a cover part including an external electrode and a magnetic material part, wherein the external electrode has a first surface contacting an upper surface of the external terminal, a second surface opposing the first surface and side surfaces connecting edges of the first surface to edges of the second surface, the magnetic material part is disposed on the coil part such that all of the side surfaces of the external electrode contact the magnetic material part and the second surface of the external electrode is exposed, a surface area of the first surface of the external electrode is larger than a surface area of the second surface of the external electrode, the external electrode includes first and second external electrodes, in a cross-section taken in a width-thickness direction, a width of an upper surface of the magnetic material part disposed between the first and second external electrodes is greater than a width of a lower surface of the magnetic material part disposed between the first and second external electrodes, and a portion of the external terminal facing the coil is concavely depressed so as to correspond to a shape of the coil.

2. The electronic component according to claim 1, wherein a maximum value of a width of the first surface of the external electrode in a long side direction is larger than a maximum value of a width of the second surface of the external electrode in the long side direction.

3. The electronic component according to claim 2, wherein the maximum value of the width of the second surface of the external electrode in the long side direction is 0.4 to 0.9 times the maximum value of the width of the first surface of the external electrode in the long side direction.

4. The electronic component according to claim 3, wherein a maximum value of a width of the first surface of the external electrode in a short side direction is larger than a maximum value of a width of the second surface of the external electrode in the short side direction.

5. The electronic component according to claim 3, wherein a maximum value of a width of the second surface of the external electrode in a short side direction is 0.5 to 0.9 times a maximum value of a width of the first surface of the external electrode in the short side direction.

6. The electronic component according to claim 2, wherein a maximum value of a width of the first surface of the external electrode in a short side direction is larger than a maximum value of a width of the second surface of the external electrode in the short side direction.

7. The electronic component according to claim 6, wherein the maximum value of the width of the second surface of the external electrode in the short side direction is 0.5 to 0.9 times the maximum value of the width of the first surface of the external electrode in the short side direction.

8. The electronic component according to claim 6, wherein at least one of a condition in which an angle between a surface including a long side of the first surface of the external electrode and a long side of the second surface of the external electrode and the short side of the first surface of the external electrode is 80 to 86 degrees and a condition in which an angle between a surface including a short side of the first surface of the external electrode and a short side of the second surface of the external electrode and the long side of the first surface of the external electrode is 70 to 86 degrees is satisfied.

9. The electronic component according to claim 2, wherein at least one of a condition in which an angle between a surface including a long side of the first surface of the external electrode and a long side of the second surface of the external electrode and the short side of the first surface of the external electrode is 80 to 86 degrees and a condition in which an angle between a surface including a short side of the first surface of the external electrode and a short side of the second surface of the external electrode and the long side of the first surface of the external electrode is 70 to 86 degrees is satisfied.

10. The electronic component according to claim 1, wherein the surface area of the second surface of the external electrode is 0.2 to 0.8 times the surface area of the first surface of the external electrode.

11. The electronic component according to claim 1, wherein a maximum value of a width of the first surface of the external electrode in a short side direction is larger than a maximum value of a width of the second surface of the external electrode in the short side direction.

12. The electronic component according to claim 11, wherein the maximum value of the width of the second surface of the external electrode in the short side direction is 0.5 to 0.9 times the maximum value of the width of the first surface of the external electrode in the short side direction.

13. The electronic component according to claim 1, wherein at least one of a condition in which an angle between a surface including a long side of the first surface of the external electrode and a long side of the second surface of the external electrode and the short side of the first surface of the external electrode is 80 to 86 degrees and a condition in which an angle between a surface including a short side of the first surface of the external electrode and a short side of the second surface of the external electrode and the long side of the first surface of the external electrode is 70 to 86 degrees is satisfied.

14. A circuit board having the electronic component according to the claim 1 mounted thereon, comprising:

a board; and a circuit pattern formed on the board and having the second surface of the external electrode electrically connected thereto.

15. The circuit board according to claim 14, further comprising a conductive solder paste provided between the second surface of the external electrode and the circuit pattern.

16. An electronic component comprising:

a base part made of a magnetic material;

a coil part provided on the base part and including a coil formed by disposing conductive patterns in a spiral shape and an external terminal connected to an end portion of the coil;

an external electrode having a first surface contacting the external terminal, a second surface opposing the first surface, and side surfaces connecting between the first surface and the second surface; and a magnetic material part covering a surface of the coil part and contacting all of the side surfaces of the external electrode such that the second surface of the external electrode is exposed, wherein a vertical cross section of the external electrode cut in a direction perpendicular to at least one of the first surface of the external electrode and the second surface of the external electrode has a trapezoidal shape, the external electrode includes first and second external electrodes, in a cross-section taken in a width-thickness direction, a width of an upper surface of the magnetic material part disposed between the first and second external electrodes is greater than a width of a lower surface of the magnetic material part disposed between the first and second external electrodes, and an upper surface of the external terminal is disposed to be higher than that of the coil.

17. The electronic component according to claim 16, wherein an intersection line between the side surface of the external electrode and the vertical cross section is a straight line.

18. The electronic component according to claim 16, wherein an intersection line between the side surface of the external electrode and the vertical cross section is a curved line.

19. The electronic component according to claim 18, wherein a gradient of a tangent line of the curved line is increased from the first surface of the external electrode toward the second surface of the external electrode.

20. An electronic component comprising:

a coil part including a coil formed by disposing conductive patterns in a spiral shape and an external terminal connected to one end of the coil, the coil part being provided between a base part made of a magnetic material and a magnetic material part; and an external electrode having a first surface contacting the external terminal, a second surface opposing the first surface, and side surfaces connecting edges of the first surface to edges of the second surface, the second surface being exposed to an outside of the magnetic material part, wherein the side surfaces contact the magnetic material and at least one of the side surfaces forms an inclination with respect to at least one of the first surface and the second surface, the external electrode includes first and second external electrodes, in a cross-section taken in a width-thickness direction, a width of an upper surface of the magnetic material part disposed between the first and second external electrodes is greater than a width of a lower surface of the magnetic material part disposed between the first and second external electrodes, and a portion of the external terminal facing the coil is concavely depressed so as to correspond to a shape of the coil.

21. The electronic component according to claim 20, wherein an angle formed by the side surface and the at least one first and second surface of the external electrode is 70 to 86 degrees.

22. The electronic component according to claim 21, wherein the electronic component is a common mode filter.

23. An electronic component comprising:

a base part made of a magnetic material;

a first primary external terminal provided at one end of a primary coil;

a second primary external terminal provided at the other end of the primary coil;

a first secondary external terminal provided at one end of a secondary coil that is magnetically coupled to the primary coil;

a second secondary external terminal provided at the other end of the secondary coil;

a first primary external electrode having a first surface contacting the first primary external terminal, a second surface opposing the first surface and side surfaces connecting between the first surface and the second surface;

a second primary external electrode having a first surface contacting the second primary external terminal, a second surface opposing the first surface and side surfaces connecting between the first surface and the second surface;

a first secondary external electrode having a first surface contacting the first secondary external terminal, a second surface opposing the first surface and side surfaces connecting between the first surface and the second surface;

a second secondary external electrode having a first surface contacting the second secondary external terminal, a second surface opposing the first surface and side surfaces connecting between the first surface and the second surface; and a magnetic material part filled between the first primary external electrode, the second primary external electrode, the first secondary external electrode, and the second secondary external electrode, wherein at least one of a condition in which a surface connecting between the first surface and the second surface is inclined with respect to the first surface, a condition in which a maximum value of a width of the first surface in a long side direction is larger than that of a width of the second surface in the long side direction, and a condition in which a maximum value of a width of the first surface in a short side direction is larger than that of a width of the second surface in the short side direction is satisfied for each of the first primary external electrode, the second primary external electrode, the first secondary external electrode, and the second secondary external electrode, in a cross-section taken in a width-thickness direction, a width of an upper surface of the magnetic material part disposed between the first primary external electrode and the first secondary external electrode is greater than a width of a lower surface of the magnetic material part disposed between the first primary external electrode and the first secondary external electrode, portions of each of the primary and secondary external terminals facing the coil are concavely depressed so as to correspond to a shape of the primary and secondary coil, respectively, and all of the side surfaces of at least one of the first primary external electrode, the second primary external electrode, the first secondary external electrode, and the second secondary external electrode are in contact with the magnetic material part.

24. The electronic component according to claim 23, wherein at least one of a condition in which the maximum value of the width of the second surface in the long side direction is 0.4 to 0.9 times the maximum value of the width of the first surface in the long side direction and a condition in which the maximum value of the width of the second surface in the short side direction is 0.5 to 0.9 times the maximum value of the width of the first surface in the short side direction is satisfied for each of the first primary external electrode, the second primary external electrode, the first secondary external electrode, and the second secondary external electrode.

* * * * *